(12) United States Patent
Komatsu

(10) Patent No.: US 6,215,725 B1
(45) Date of Patent: *Apr. 10, 2001

(54) CLOCK-SYNCHRONIZED MEMORY

(75) Inventor: Koji Komatsu, Nara (JP)

(73) Assignee: Sharp Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,807

(22) Filed: Jul. 21, 1998

Related U.S. Application Data

(63) Continuation of application No. 09/118,807, filed on Jul. 20, 1998, now Pat. No. 6,041,726.

(30) Foreign Application Priority Data

Jul. 23, 1997 (JP) .................................................. 9-196791

(51) Int. Cl.[7] ....................................................... G11C 8/00
(52) U.S. Cl. .............................................. 365/233; 365/226
(58) Field of Search ..................................... 365/233, 226

(56) References Cited

U.S. PATENT DOCUMENTS

| 5,699,302 | * | 12/1997 | Shinozaki et al. | ............... 365/189.05 |
| 5,793,680 | * | 8/1998 | Okajiwa | ........................... 365/233 X |
| 5,808,961 | * | 9/1998 | Sawada | ................................ 365/233 |
| 5,841,731 | * | 11/1998 | Shirozaki | ............................. 365/233 |

FOREIGN PATENT DOCUMENTS 07093970    4/1995    (JP) .

* cited by examiner

*Primary Examiner*—A. Zarabian
(74) *Attorney, Agent, or Firm*—Morrison & Foerster LLP

(57) ABSTRACT

A clock-synchronized memory includes a plurality of memory cells and a plurality of mode registers in which respectively different operation modes are set, the clock-synchronized memory outputting data stored in the plurality of memory cells in one of the respectively different operation modes and in synchronization with a clock signal. The clock-synchronized memory further includes: a detection circuit for detecting a power potential applied to the clock-synchronized memory; and a mode register selection circuit for selecting one of the respectively different operation modes, the selection being made in accordance with an output signal from the detection circuit representing the power potential.

4 Claims, 13 Drawing Sheets

CLOCK-SYNCHRONIZED MEMORY

This appln. is a continuation of Ser. No. 09/118,807 filed Jul. 20, 1998, now U.S. Pat. No. 6,041,726.

BACKGROUND OF THE INVENTION

1. Field of the Invention

The present invention relates to a memory of a clock-synchronized type for inputting and outputting data. In particular, the present invention relates to a synchronous memory which includes a register for setting an operation mode and operates in an operation mode (defined by burst length, wrap type, and CAS latency) which is determined in accordance with the contents set in the mode register.

2. Description of the Related Art

In recent years, memories which permit faster access have been in demand due to improvements in the operation frequencies of microprocessors. Answers to such demands include clock-synchronized type memories, e.g., synchronous DRAMs.

A synchronous DRAM includes a mode register for setting an operation mode. By setting an operation mode (defined by burst length, wrap type, and CAS latency) in the mode register, the synchronous DRAM can perform an operation which is optimally selected for any given system incorporating the synchronous DRAM.

Herein, the "burst length" refers to the number of data units which can be consecutively input or output. For example, either 1, 2, 4, 8 or a full-page can be selected as the burst length. The "wrap type" refers to the manner in which column addresses, which are internally generated during a burst access, are varied. For example, either a sequential method (under which the column addresses are sequentially changed within the same bank) or an interleave method (under which the column addresses are scrambled) can be selected as the wrap type. The "CAS latency" refers to the number of clock pulses that elapse before the first data is read after inputting a read command. For example, either 1, 2, or 3 can be selected as the CAS latency.

FIG. 18 is a block diagram schematically illustrating the structure of a synchronous DRAM.

The synchronous DRAM shown in FIG. 18 includes a memory cell array 21, a row decoder 22, a column decoder 23, a row address buffer 24, a column address buffer 25, a data control circuit 26, a data input/output buffer 27, a control logic 28, and a mode register setting circuit 29. The mode register setting circuit 29 includes a mode register 31 as shown in FIG. 19.

In FIG. 18, SS denotes an output signal from the mode register within the mode register setting circuit 29, which is input to the control logic 28.

As can be seen in FIG. 19, the mode setting function of the synchronous DRAM is accomplished by inputting to the input-only pins various codes (commands) which represent operations. Usually, a chip select signal CS/, a row address strobe signal RAS/, a column address strobe signal CAS/, and a write enable signal WE/ are set to the "Low" level, and address terminals A0 to A6 are utilized as terminals for inputting data.

FIG. 19 is a simplified diagram showing the structure of the mode register setting circuit 29. The mode register setting circuit 29 includes AND gates 35, 36, and 37 as well as the mode register 31. The mode register 31 includes 3-bit D flip-flops 32, 33, and 34. The outputs of the D flip-flops 32, 33, and 34 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 19.

Each of the AND gates 35, 36, and 37 is opened responsive to a mode register set signal MRS. The output of each of the AND gates 35, 36, and 37 is determined in accordance with the value of a 7 bit address A0 to A6 and the mode register set signal MRS. The mode register set signal MRS is the output of the AND gate 38. It is possible to set a given operation mode in the mode register 31 by setting the chip select signal CS/, the row address strobe signal RAS/, the column address strobe signal CAS/, and the write enable signal WE/ to the "Low" level and concurrently supplying a predetermined address value A0 to A6.

A mode setting in the mode register is performed in an initialization routine before memory access. Before access to a memory occurs, the user sets the content of the mode register in accordance with the memory accessing specification and intended mode of use of the memory. Among the parameters of the operation mode which is set in the mode register, the "CAS latency" refers to the number of clock pulses that elapse before the first data is read or written after latching a CAS address (column address) during a memory access. Therefore, if the CAS latency is set to "2", the first data will be read or stored 2 clock pulses after latching a CAS address.

In general, a semiconductor memory such as a DRAM requires some time after power is supplied to the memory until the power voltage Vcc becomes stabilized to a predetermined potential so as to stabilize the internal circuitry. A given operation mode may be set in the mode register in the above-described sequence. This prolongs the time which elapses before the memory becomes accessible after power is supplied. Furthermore, it is necessary to set a mode via an initialization routine or the like, which needs to be run before a memory access occurs after supplying power.

As a solution to the above problem, it has been proposed in the field of synchronous DRAMs to set initial values for the mode register by means of non-volatile switching elements (e.g., laser fuses or electric fuses) and automatically set the initial values in the mode register upon detecting the rise of the power voltage after power is supplied, thereby reducing the complexity associated with mode setting via an initialization routine or the like (Japanese Laid-Open Publication No. 7-93970).

In general, a higher power potential makes for a shorter memory access time, thereby making it possible to reduce the latency, assuming that the memory operates with the same clock signal. In this case, prefixing the content of the mode register will make it impossible to set a latency which is optimum in view of the power potential.

Moreover, it would complicate the process and management of manufacture to produce multiple types of devices with different operation modes which are in accordance with respectively different device specifications.

SUMMARY OF THE INVENTION

A clock-synchronized memory according to the present invention includes a plurality of memory cells and a plurality of mode registers in which respectively different operation modes are set, the clock-synchronized memory outputting data stored in the plurality of memory cells in one of the respectively different operation modes and in synchronization with a clock signal, wherein the clock-synchronized memory further includes: a detection circuit for detecting a power potential applied to the clock-synchronized memory; and a mode register selection circuit for selecting one of the respectively different operation modes, the selection being made in accordance with an output signal from the detection circuit representing the power potential.

In one embodiment of the invention, the clock-synchronized memory is a clock-synchronized read only memory; and contents of each of the plurality of mode registers are set when the data is written to the memory cell, the contents defining the operation mode.

In another embodiment of the invention, each of the plurality of mode registers includes a MOS transistor having a channel region; the contents which are set in the mode register are written by selectively implanting ions of an impurity into the channel region of the MOS transistor, the impurity having a different conductivity type from a conductivity type of the channel region of the MOS transistor; and the implantation of the ions of the impurity is performed by using a mask which is used when writing the data to the memory cell.

In accordance with the present invention, a plurality of mode registers are provided in which predetermined operation mode parameters, e.g., latency, are previously set. It becomes possible to set the optimum latency, etc., in view of a given power potential, by selecting one of the mode registers in accordance with the power potential. Furthermore, it is unnecessary to produce multiple types of devices with different operation modes which are in accordance with respectively different device specifications. Rather, by only producing one type of device that accommodates the respectively different device specifications, the process and management of manufacture can be prevented from becoming complicated.

Thus, the invention described herein makes possible the advantages of: (1) providing a clock-synchronized memory including a plurality of mode registers in which predetermined operation mode parameters, e.g., latency, are previously set, thereby allowing for the selection of the optimum latency, etc., in view of a given power potential; and (2) providing a clock-synchronized ROM which allows a mode register setting without the need to employ an additional manufacturing step, thereby preventing an increase in chip cost.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

Figure 1:
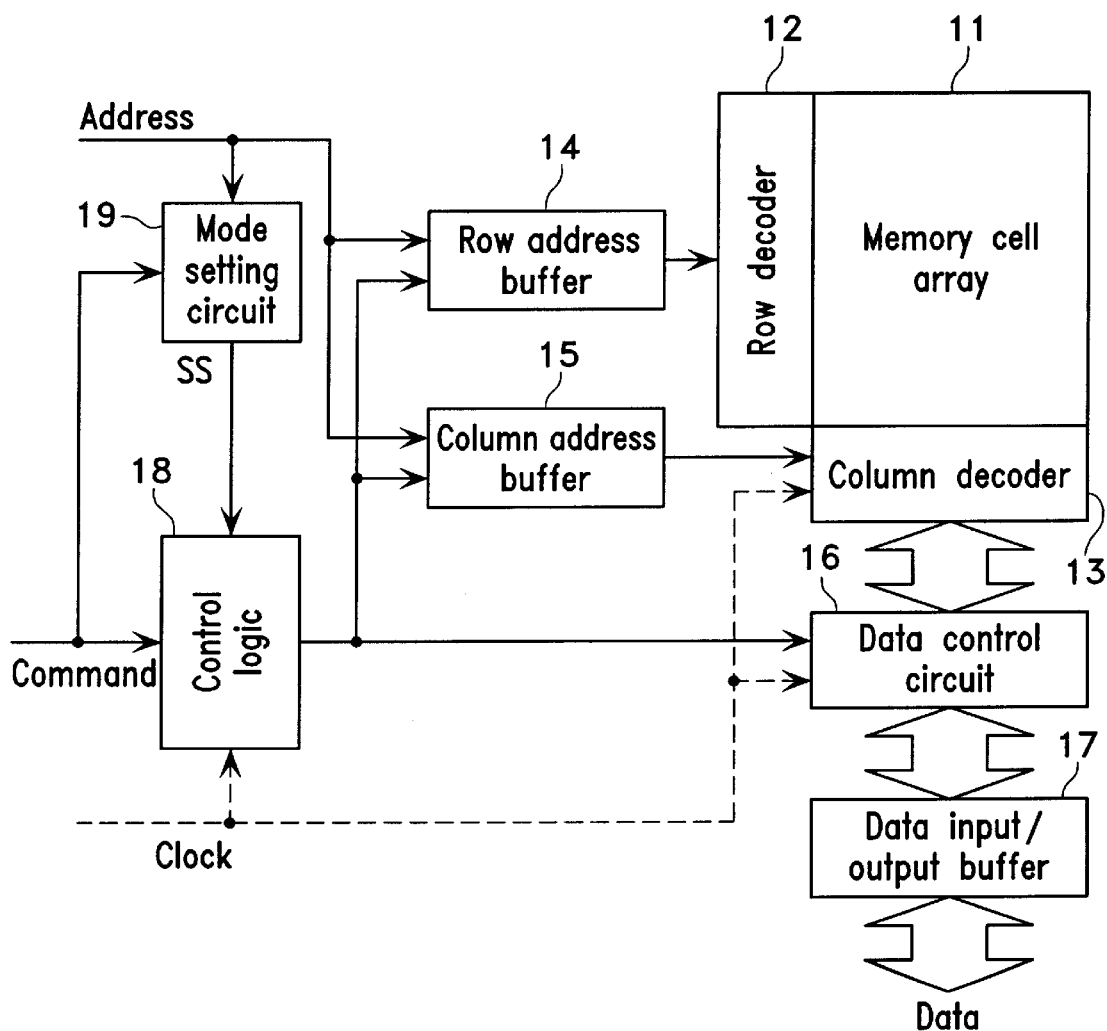
FIG. 1 is a block diagram schematically illustrating the structure of a synchronous DRAM according to the present invention.

FIG. 1 is a block diagram schematically illustrating the structure of a synchronous DRAM according to the present invention. The synchronous DRAM shown in FIG. 1 includes a memory cell array 11, a row decoder 12, a column decoder 13, a row address buffer 14, a column address buffer 15, a data control circuit 16, a data input/output buffer 17, a control logic 18, and a ode setting circuit 19 including mode registers.

In FIG. 1, SS denotes a signal (operation mode signal) which is output from the mode registers within the mode setting circuit 19 and input to the control logic 18. As a result, the synchronous DRAM operates in a mode which is set in the mode setting circuit 19. It will be appreciated that the operation mode signal and the modes which can be set therein may be the same signal and modes as those employed in a standard synchronous DRAM.

Figure 2:
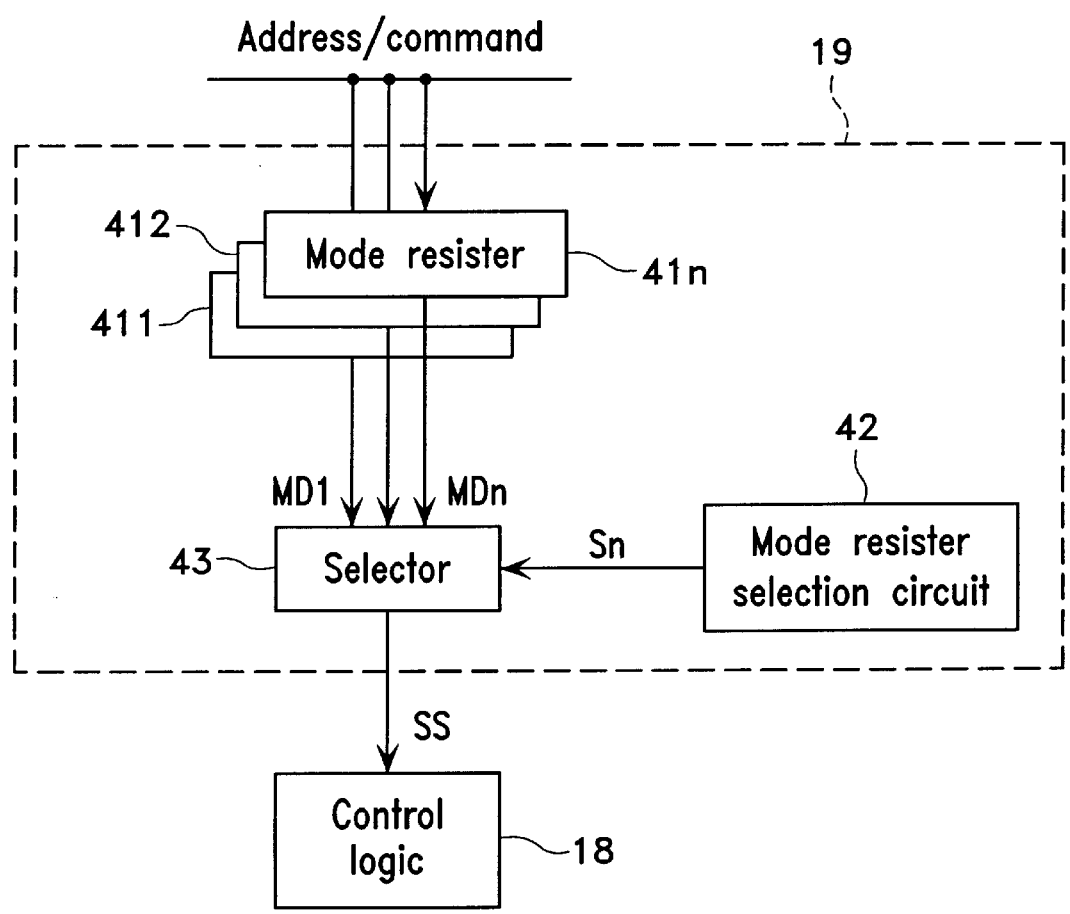
FIG. 2 is a block diagram schematically illustrating the structure of a mode setting circuit 19 in the synchronous DRAM of FIG. 1.

Hereinafter, a method for setting initial values in the mode setting circuit 19 in the synchronous DRAM of FIG. 1 will be described with reference to FIG. 2.

The mode setting circuit 19 includes a number n of mode registers 411, 412, ..., and 41n, a mode register selection circuit 42, and a selector 43. Different operation modes are set in the mode registers 411, 412, ..., and 41n.

The selector 43 receives a selection signal Sn which is output from the mode register selection circuit 42. The selector 43 is controlled based on the selection signal Sn so as to select one of the signals (operation mode signals) MD1, ..., and MDn, which are respectively output from the n mode registers 411, 412, ..., and 41n. The selected output signal SS is input to the control logic 18 so that the synchronous DRAM operates in a mode which is set in the selected mode register.

Figure 3:
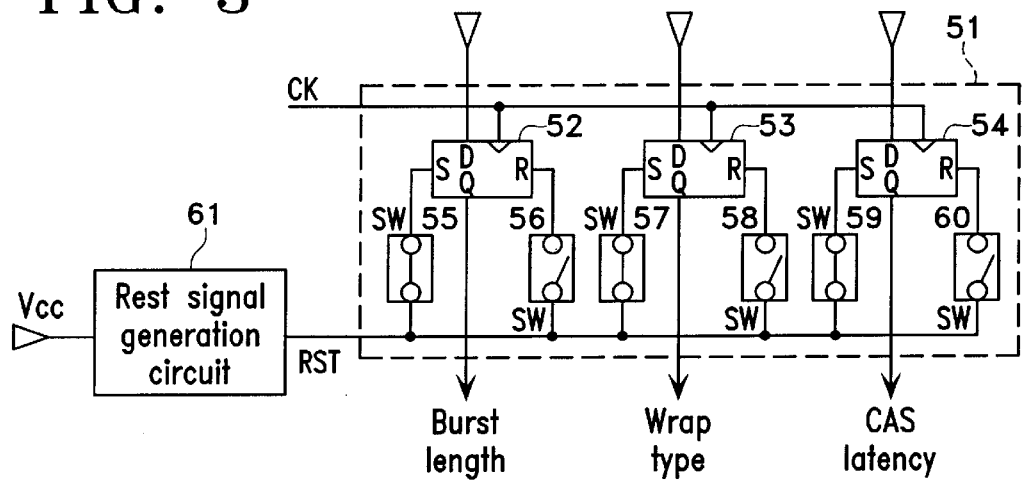
FIG. 3 is a circuit diagram illustrating the structure of a mode register according to the present invention.

FIG. 3 is a circuit diagram illustrating the structure of each mode register according to the present invention.

In the present specification, a "mode register" is defined as any element capable of storing operation modes, and is not limited to those composed essentially of flip-flops. For example, a mode register consisting only of fuses can be employed, as will become apparent in the discussion to follow.

As can be seen in FIG. 3, The mode register 51 includes 3-bit D flip-flops 52, 53, and 54 each having a set terminal and a reset terminal. The output signals of the D flip-flops 52, 53, and 54 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 3.

Further with reference to FIG. 3, switch elements 55 and 56 are coupled to the set (S) and reset (R) terminals of the D flip-flop 52; switch elements 57 and 58 are coupled to the set (S) and reset (R) terminals of the D flip-flop 53; and switch elements 59 and 60 are coupled to the set (S) and reset (R) terminals of the D flip-flop 54, respectively. The other ends of the switches 55 to 60 are coupled in common to the output of a reset signal generation circuit 61. The reset signal generation circuit 61 outputs a reset signal RST upon supply of power. For example, the switches 55 to 60 can be composed of fuse elements which are capable of being disrupted by laser or electrical means, and are selectively disrupted during the manufacture process in accordance with the operation mode to be set. Alternatively, the switches 55 to 60 can be wiring patterns which can be selected to be conductive or non-conductive in the layout design.

Owing to the above-described switching element configuration, the initial values which are expressed by ON or OFF states of the respective switching elements are automatically set in the associated D flip-flops 52, 53, and 54 responsive to a reset signal RST which is output upon supply of power.

In the mode register 51 of FIG. 3, the mode register 51 receives external operation mode signals via address terminals, and the setting values expressed by the external operation mode signals are input to the D flip-flops 52, 53, and 54 in synchronization with a clock signal CK. As a result, the operation mode can be changed accordingly. Thus, in the case where it is desirable to update the content of the mode register without using an initial value thereof, it is possible to set a given operation mode in the mode register by setting the chip select signal CS/, the row address strobe signal RAS/, the column address strobe signal CAS/, and the write enable signal WE/ to the "Low" level and utilizing the address terminals as data input terminals, as in conventional methods.

The mode register 51 of FIG. 3 allows rewriting of the contents stored therein. However, in the case where there is no need to rewrite the contents of the mode register, the contents of the mode register only need to be set via the switching elements, thereby making it possible to realize a simplified mode register.

Figure 4:
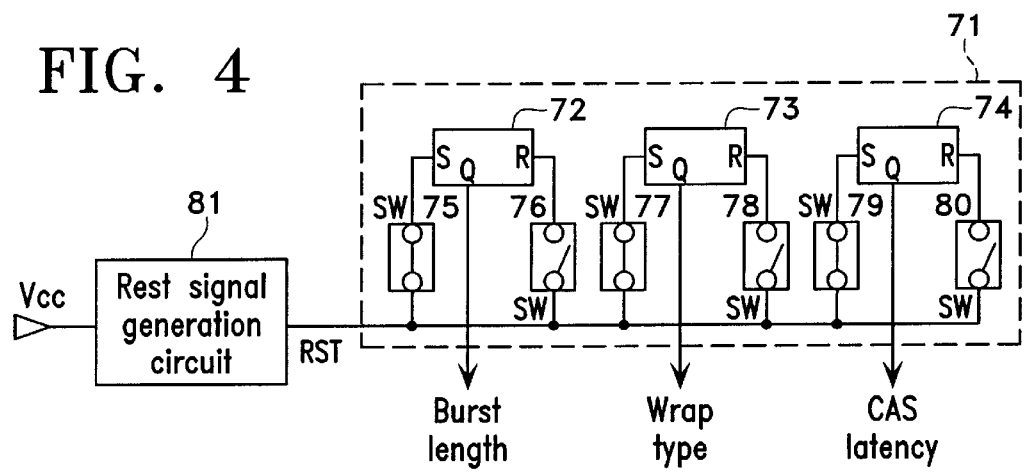
FIG. 4 is a block diagram schematically illustrating the structure of a simplified mode register according to the present invention.

FIG. 4 is a block diagram schematically illustrating the structure of such a simplified mode register 71. The mode register 71 of FIG. 4 eliminates the need to supply input to the flip-flops via address terminals.

The mode register 71 includes 3-bit D flip-flops 72, 73, and 74 each having a set terminal and a reset terminal. The output signals of the D flip-flops 72, 73, and 74 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 4.

With reference to FIG. 4, switch elements 75 and 76 are coupled to the set (S) and reset (R) terminals of the D flip-flop 72; switch elements 77 and 78 are coupled to the set (S) and reset (R) terminals of the D flip-flop 73; and switch elements 79 and 80 are coupled to the set (S) and reset (R) terminals of the D flip-flop 74, respectively. The other ends of the switches 75 to 80 are coupled in common to the output of a reset signal generation circuit 81. The reset signal generation circuit 81 outputs a reset signal RST upon supply of power. For example, the switches 75 to 80 can be composed of fuse elements which are capable of being disrupted by laser or electrical means, and are selectively disrupted during the manufacture process in accordance with the operation mode to be set.

Owing to the above-described configuration, the initial values which are expressed by ON or OFF states of the respective switching elements are automatically set in the associated D flip-flops 72, 73, and 74 responsive to a reset signal RST which is output upon supply of power. In this case, the contents of the mode register are fixed; that is, the contents of D flip-flops 72, 73, and 74 cannot be rewritten.

Figure 5:
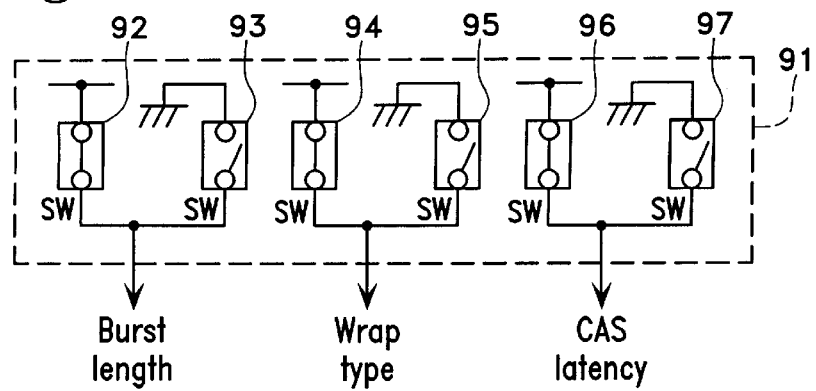
FIG. 5 is a block diagram schematically illustrating the structure of a further simplified mode register according to the present invention.

FIG. 5 is a block diagram schematically illustrating the structure of a further simplified mode register 91 according to the present invention. In the mode register 91, flip-flops are omitted from the mode register 51 in FIG. 3.

The mode register 91 includes six switching elements 92 to 97, where switching elements 92 and 93 are paired up; switching elements 94 and 95 are paired up; and switching elements 96 and 97 are paired up. One end of each switching element in the first pair (92 and 93) is coupled to a power potential or a ground potential, whereas the other ends of the pair of switching elements 92 and 93 are connected in common to output a signal which represents the burst length. One end of each switching element in the second pair (94 and 95) is coupled to a power potential or a ground potential, whereas the other ends of the pair of switching elements 94 and 95 are connected in common to output a signal which represents the wrap type. One end of each switching element in the third pair (96 and 97) is coupled to a power potential or a ground potential, whereas the other ends of the pair of switching elements 96 and 97 are connected in common to output a signal which represents the CAS latency.

Figure 6:
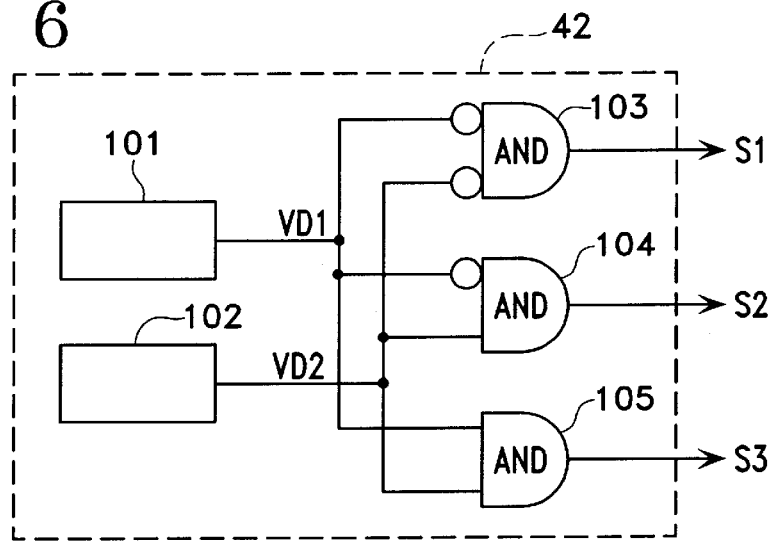
FIG. 6 is a block diagram illustrating an exemplary structure of a mode register selection circuit 42 in the case where the number of mode registers is three.

The structure of a mode register selection circuit 42 (FIG. 2) will be described with reference to FIG. 6. FIG. 6 is a block diagram illustrating an exemplary structure of the mode register selection circuit 42 in the case where the number of mode registers is three.

The mode register selection circuit 42 is a circuit for detecting the power potential of the memory and outputting a selection signal Sn which is in accordance with the power potential level.

The mode register selection circuit 42 in FIG. 6 includes a first power potential detection circuit 101, a second power potential detection circuit 102, and AND circuits 103, 104, and 105.

The first power potential detection circuit 101 detects whether or not the power potential Vcc is equal to or higher than a second reference potential Vb2. If the power potential Vcc is determined to be equal to or higher than the second reference potential Vb2, the first power potential detection circuit 101 outputs a detection output signal VD1 which is at a high level. If the power potential Vcc is determined to be lower than the second reference potential Vb2, the first power potential detection circuit 101 outputs a detection output signal VD1 which is at a low level.

The second power potential detection circuit 102 detects whether or not the power potential Vcc is equal to or higher than a first reference potential Vb1. If the power potential Vcc is determined to be equal to or higher than the first reference potential Vb1, the second power potential detection circuit 102 outputs a detection output signal VD2 which is at a high level. If the power potential Vcc is determined to be lower than the first reference potential Vb1, the second power potential detection circuit 102 outputs a detection output signal VD2 which is at a low level.

In accordance with the mode register selection circuit 42, the detection output signals from the two power potential detection circuits 101 and 102 are decoded by the three AND gates 103, 104 and 105, so that one of the selection signals S1, S2, and S3 is output in accordance with the level of the power potential Vcc.

Table 1 shows an exemplary relationship between selection signals S1, S2, and S3 which are output from the mode register selection circuit 42 in FIG. 6 and the power potential Vcc:

TABLE 1

| power potential | VD1 | VD2 | S1 | S2 | S3 |
|---|---|---|---|---|---|
| Vcc < Vb1 | 0 | 0 | 1 | 0 | 0 |
| Vb1 ≦ Vcc < Vb2 | 0 | 1 | 0 | 1 | 0 |
| Vb2 ≦ Vcc | 1 | 1 | 0 | 0 | 1 |

Alternatively, the selection signals S1, S2, and S3 and the power potential Vcc may take a relationship as shown in Table 2:

TABLE 2

| power potential | VD1 | VD2 | S1 | S2 | S3 |
|---|---|---|---|---|---|
| Vcc < Vb1 | 0 | 0 | 1 | 0 | 0 |
| Vb1 < Vcc ≦ Vb2 | 0 | 1 | 0 | 1 | 0 |
| Vb2 < Vcc | 1 | 1 | 0 | 0 | 1 |

By decoding the detection output signals VD1 and VD2 from the two power potential detection circuits 101 and 102 in the three AND gates 103, 104, and 105, the mode register selection circuit 42 in FIG. 6 outputs one of the selection signals S1, S2, and S3 in accordance with the level of the power potential Vcc.

Figure 7:
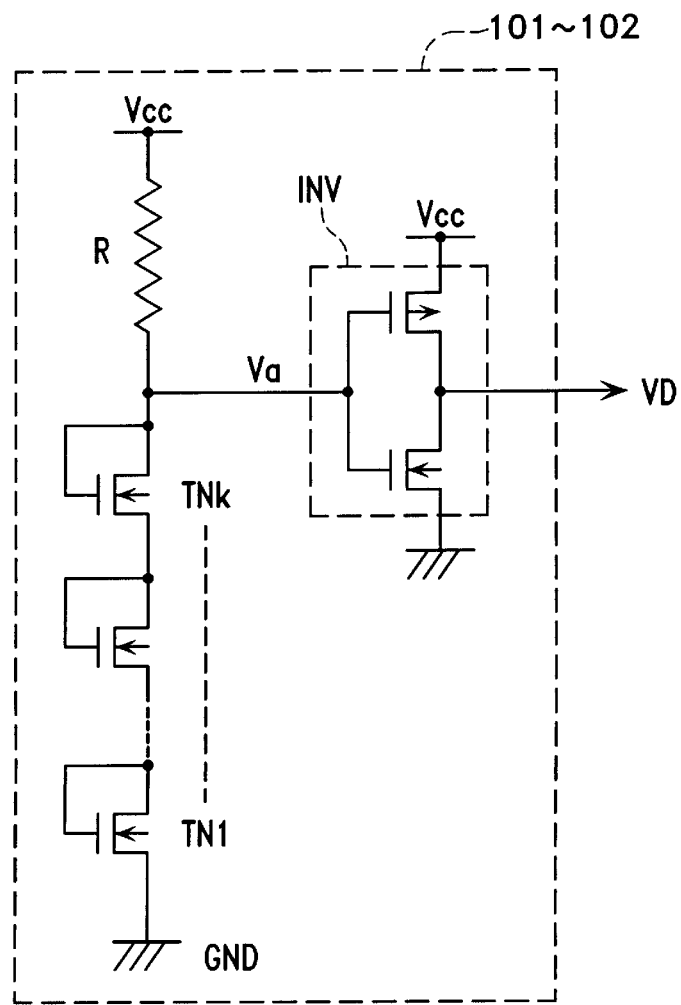
FIG. 7 is a circuit diagram illustrating a first or second power potential detection circuit 101 or 102.

FIG. 7 is a circuit diagram illustrating the first or second power potential detection circuit 101 or 102.

As shown in FIG. 7, the first or second power potential detection circuit 101 or 102 includes a number k of NMOS transistors $TN_1, \ldots,$ and $TN_k$ in such a manner that a drain/source of the NMOS transistor $TN_1$ is coupled to a source/drain of the NMOS transistor $TN_2$; a drain/source of the NMOS transistor $TN_2$ is coupled to a source/drain of the NMOS transistor $TN_3$, and so on. A gate and a drain of each NMOS transistor are interconnected. A resistor R is coupled between a power potential Vcc and a node Va. The node Va is coupled to the input of an invertor INV. The output signal of the invertor INV is a detection output signal VD.

Figure 8:
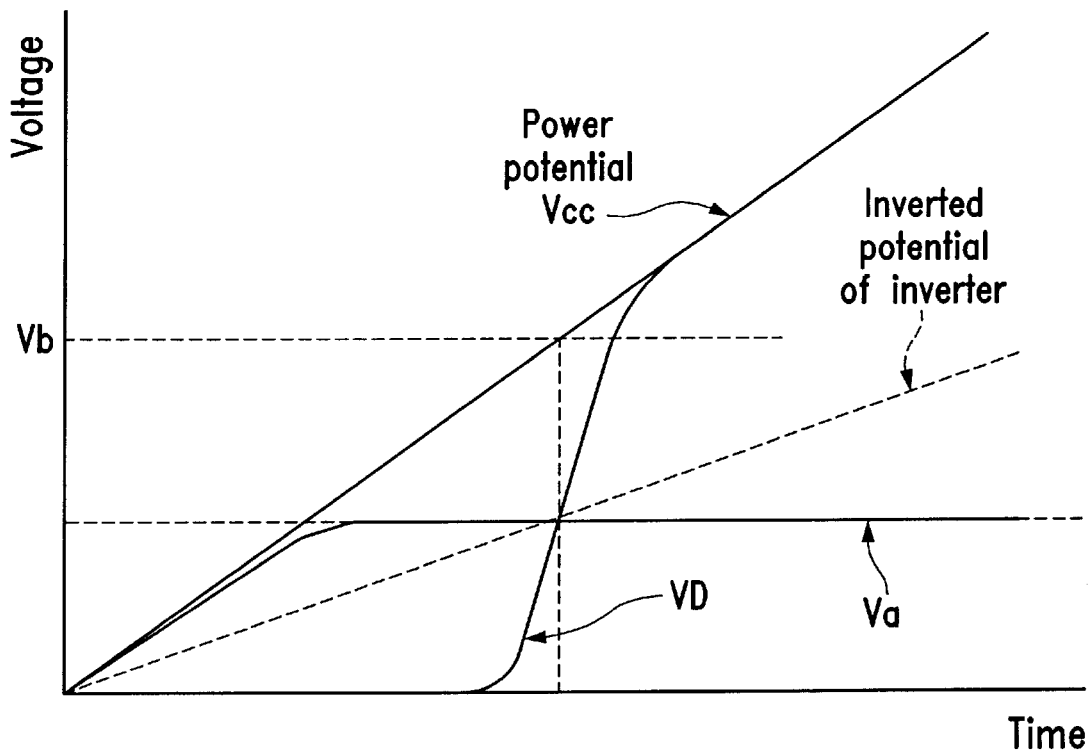
FIG. 8 is a graph describing an operation of the power potential detection circuit.

Now, the operation of the power potential detection circuit of FIG. 7 will be described with reference to FIG. 8. FIG. 8 is a graph describing an operation of the power potential detection circuit.

As the power potential Vcc increases, the potential of the node Va increases up to a sum of the threshold values of k NMOS transistors $TN_1, \ldots,$ and $TN_k$ (where the potential of the node Va becomes saturated), while the inverted potential of the invertor INV keeps increasing. At the point where the power potential Vcc reaches a reference potential Vb, the relationship between the potential of the node Va and the inverted potential of the invertor INV is reversed, so that the level of the output signal VD is inverted, i.e., the level the output signal VD shifts from a "Low" level to a "High" level.

Figure 9:
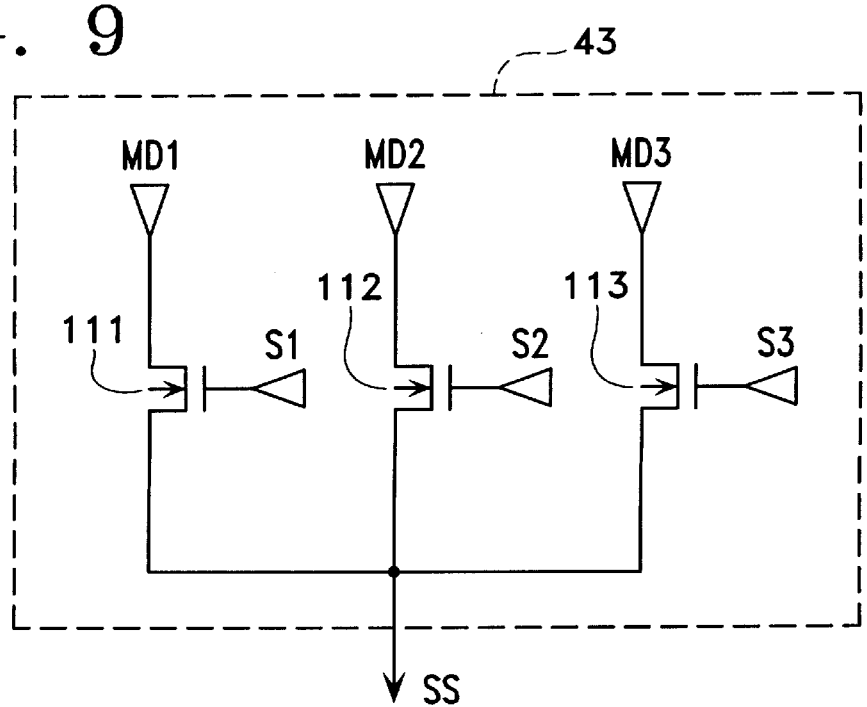
FIG. 9 is a circuit diagram illustrating the structure of a selector 43.

Accordingly, if the power potential Vcc is lower than the reference potential Vb, the power potential detection circuit shown in FIG. 9 outputs a detection output signal VD which is at the "Low" level. If the power potential Vcc is equal to or higher than the reference potential Vb, the power potential detection circuit shown in FIG. 9 outputs a detection output signal VD which is at the "High" level.

A reference potential Vb can be arbitrarily set in the above-described power potential detection circuit by adjusting the number of NMOS transistors TN employed and/or adjusting the resistance of the resistor R.

Hereinafter, the structure of the selector 43 will be described with reference to FIG. 9. FIG. 9 is a circuit diagram illustrating the structure of the selector 43.

The selector 43 includes three NMOS transistors 111, 112, and 113 which can selectively conduct in accordance with the selection signals Sn (i.e., S1–S3) output from the mode register selection circuit 42.

In FIG. 9, MD1, MD2, and MD3 denote output signals from mode registers each having the structure shown in FIG. 4; SS denotes an output signal, which is output to the control logic 18 (FIG. 1).

For example, if the power potential Vcc is lower than Vb1, only the selection signal S1 is at the "High" level so that only the NMOS transistor 111 conducts. As a result, the output signal MD1 from the mode register 411 is supplied to the control logic 18 as the output signal of the selector 43.

Hereinafter, an exemplary clock-synchronized memory having the following specification will be described: a first reference potential Vb1 of 2.7 V; a second reference potential Vb2 of 4.0 V; an access time of 30 ns at a power potential of 2.5 V; an access time of 20 ns at a power potential of 3.0 V; an access time of 10 ns at a power potential of 5.0 V. Under the condition that the clock frequency is 100 MHz (i.e., having a 10 ns cycle), the CAS latency values of the mode registers 411 (MD1), 412 (MD2), and 413 (MD3) are set at "3", "2", and "1", respectively, as initial values.

When the clock-synchronized memory is used at a power potential of 2.5 V, the mode register selection circuit 42 outputs a selection signal S1 at the High level and selection signals S2 and S3 at the Low level, so that the selector 43 selects the mode register 411 (MD1) based on the selection signals S1, S2, and S3. In other words, "3" is set as the CAS latency.

Similarly, when the clock-synchronous memory is used at a power potential of 3.0 V, the mode register selection circuit 42 outputs a selection signal S2 at the High level and selection signals S1 and S3 at the Low level, so that the selector 43 selects the mode register 412 (MD2) based on the selection signals S1, S2, and S3. In other words, "2" is set as the CAS latency.

Similarly, when the clock-synchronized memory is used at a power potential of 5.0 V, the mode register selection circuit 42 outputs a selection signal S3 at the High level and selection signals S1 and S2 at the Low level, so that the selector 43 selects the mode register 412 (MD3) based on the selection signals S1, S2, and S3. In other words, "1" is set as the CAS latency.

Thus, the clock-synchronized memory according to the present invention allows an automatic setting of the optimum CAS latency in accordance with the power potential, without requiring a mode setting made via an initialization routine.

Figure 10:
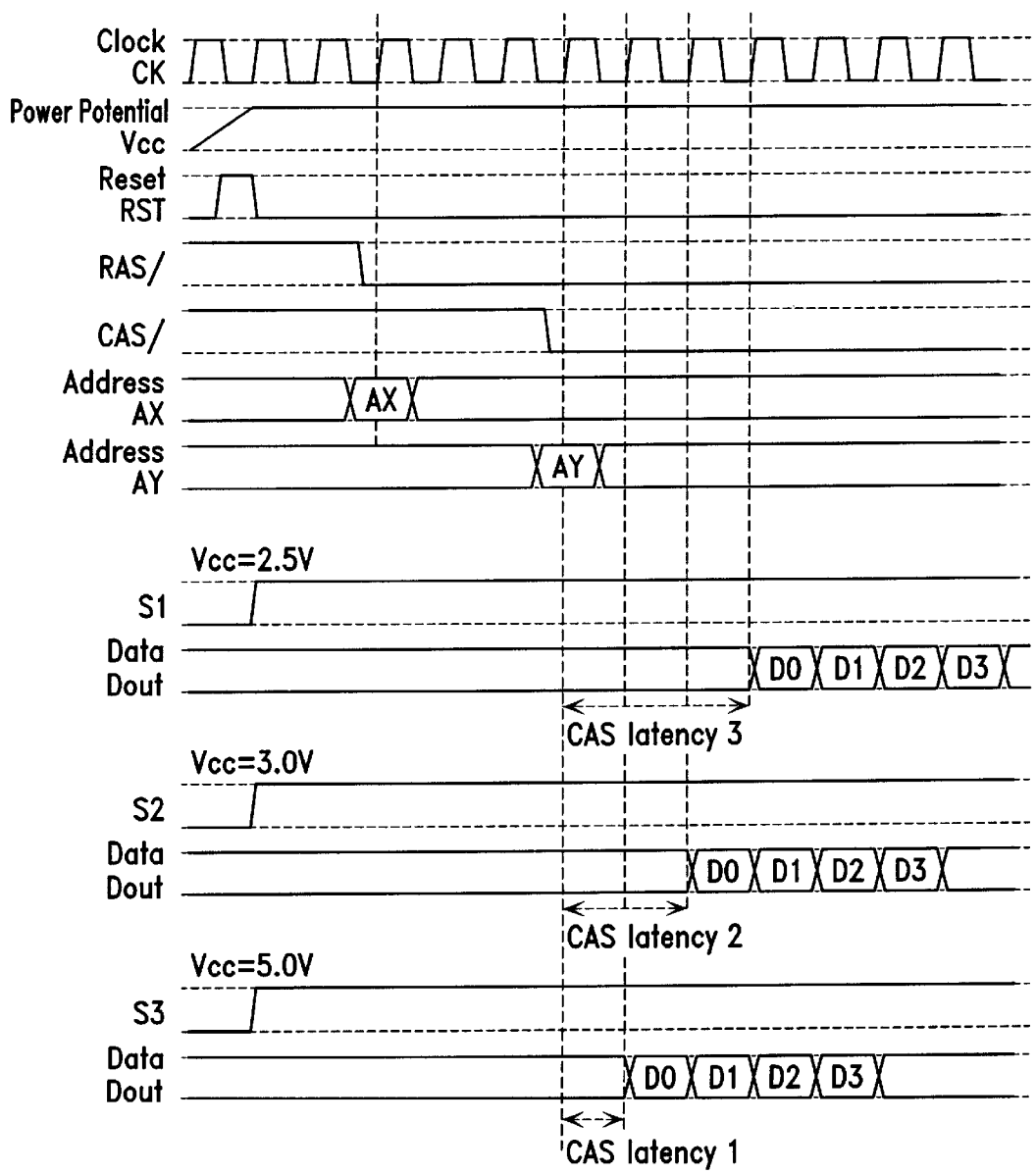
FIG. 10 is a timing diagram illustrating the operation timing of a clock-synchronized memory according to the present invention.

Next, the operation timing of the clock-synchronized memory according to the present invention will be described with reference to FIG. 10.

In response to the rise of the power potential Vcc, a reset signal RST is generated so that predetermined initial values are set in the respective mode registers. Thereafter, one of the selection signals S1, S2, and S3 shifts to the "High" level in response to the power potential Vcc having entered a stable state.

For example, the selection signal S1 goes "High" with a power potential of 2.5 V; the selection signal S2 goes "High" with a power potential of 3.0 V; and the selection signal S3 goes "High" with a power potential of 5.0 V. A predetermined mode register is accordingly selected. After the column address strobe signal CAS/ goes "Low", a column address AY is input. After the lapse of the CAS latency stored in the selected mode register, data D0 to D3 will be output.

Although the above description illustrates an embodiment incorporating three mode registers, the present invention is generally applicable to embodiments incorporating two or more mode registers for operation mode setting.

Hereinafter, a clock-synchronized mask ROM according to another embodiment of the clock-synchronized memory of the present invention will be described with reference to FIG. 11.

The clock-synchronized mask ROM includes a memory cell array 121, a row decoder 122, a column decoder 123, a row address buffer 124, a column address buffer 125, a data control circuit 126, a data output buffer 127, a control logic 128, and a mode setting circuit 129.

Figure 11:
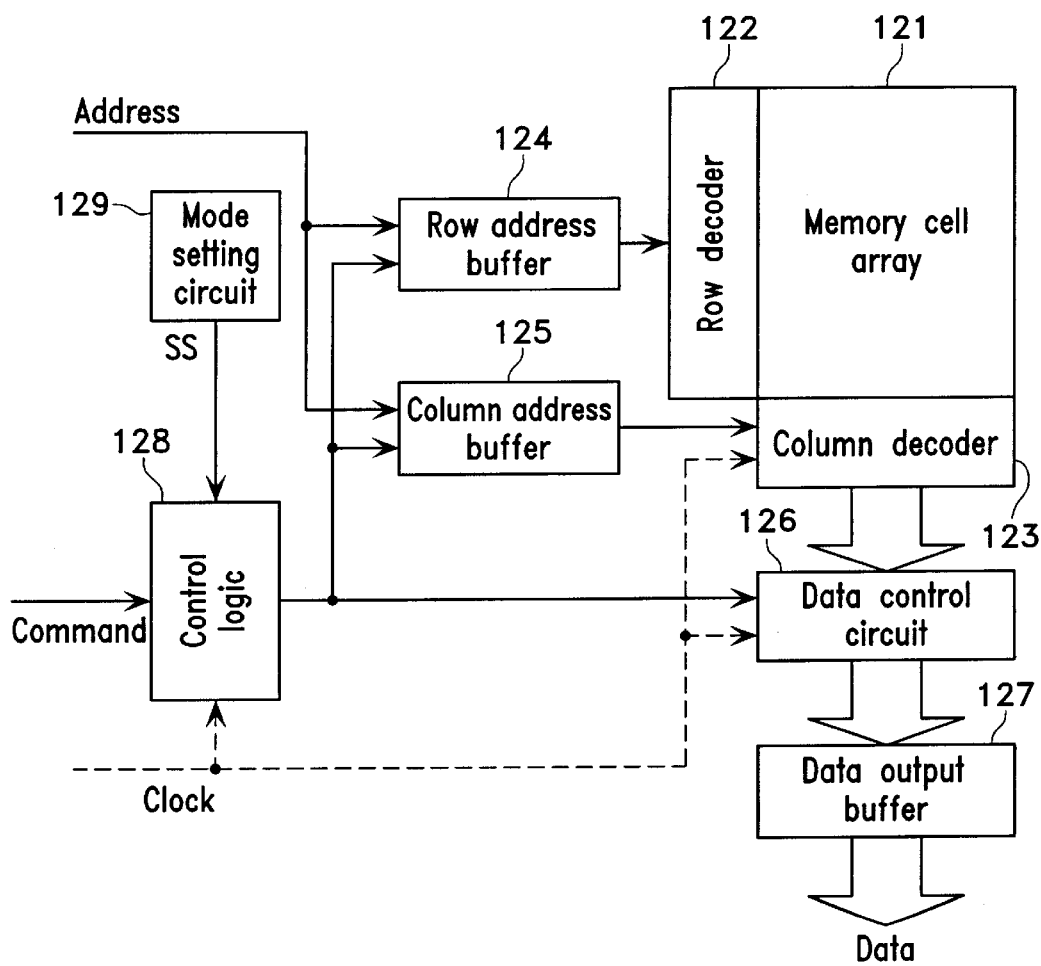
FIG. 11 is a block diagram illustrating a clock-synchronized mask ROM, according to another embodiment of the clock-synchronized memory of the present invention.

In FIG. 11, SS denotes an output signal (operation mode signal) from the mode register within the mode setting circuit 129, which is input to the control logic 128. As a result, the clock-synchronized mask ROM of FIG. 11 operates in a mode which is set in the mode setting circuit 129.

Figure 12:
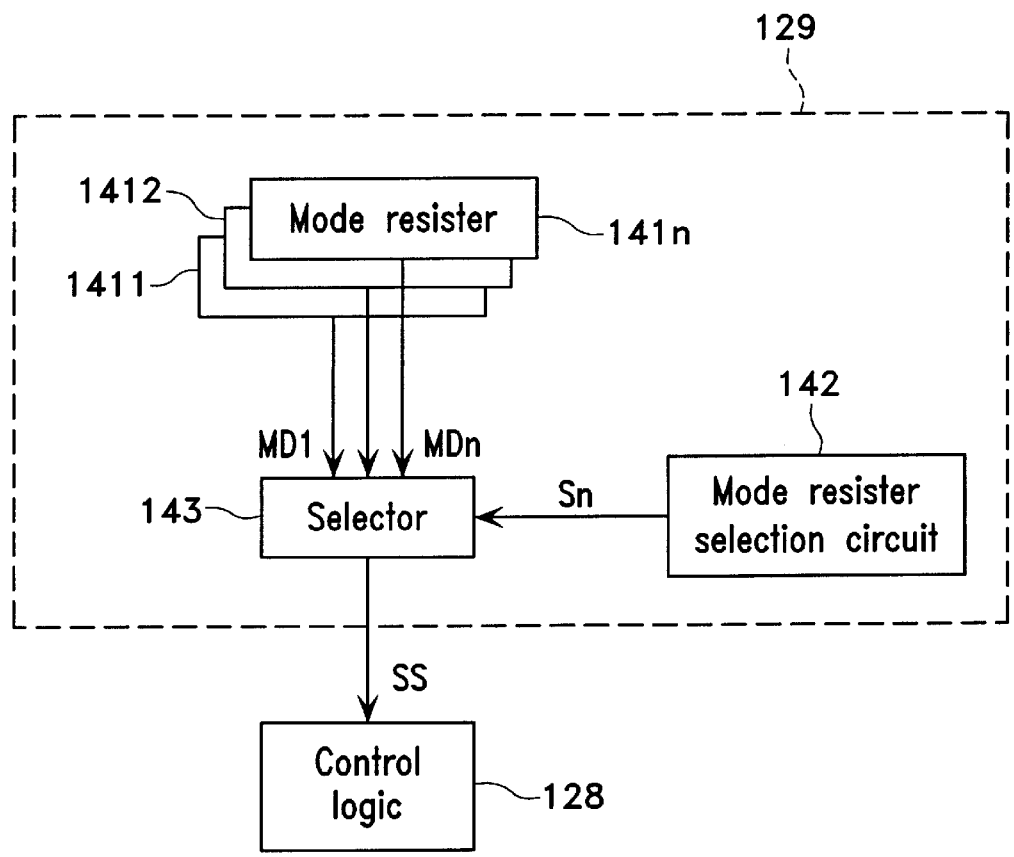
FIG. 12 is a simplified block diagram illustrating the structure of a mode setting circuit 129 in the clock-synchronized mask ROM shown in FIG. 11.

FIG. 12 is a simplified block diagram illustrating the structure of the mode setting circuit 129 in the clock-synchronized mask ROM shown in FIG. 11.

The mode setting circuit 129 includes a number n of mode registers 1411, 1412, . . . , and 141n, a mode register selection circuit 142, and a selector 143. Different operation modes are set in the mode registers 1411, 1412, . . . , and 141n.

The selector 143 receives a selection signal Sn which is output from the mode register selection circuit 142. The selector 143 is controlled based on the selection signal Sn so as to select one of the signals (operation mode signals) MD1, . . . , and MDn, which are respectively output from the n mode registers 1411, 1412, and 141n.

The selected output signal SS is input to the control logic 128 so that the clock-synchronized mask ROM in FIG. 11 operates in a mode which is set in the selected mode register.

In the clock-synchronized mask ROM according to the present embodiment of invention, the setting of the initial values for the mode registers 1411 to 141n can be performed in the step of writing data in the memory cell.

Hereinafter, a method for setting initial values in the mode registers 1411 to 141n concurrently with writing data into the memory cell will be described with reference to FIG. 13 to FIG. 17.

Figure 13:
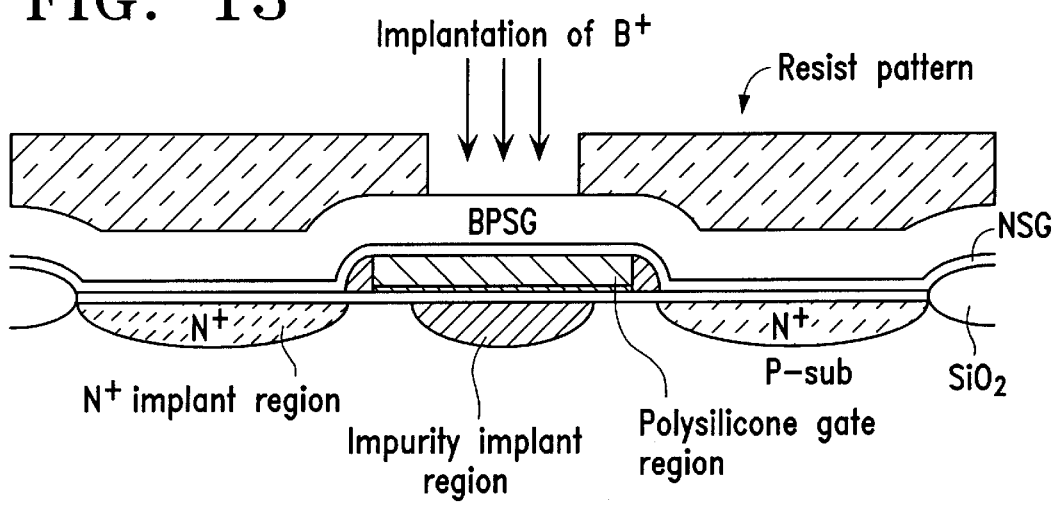
FIG. 13 is a partial cross-sectional view showing mode registers 1411 to 141n.
Figure 14:
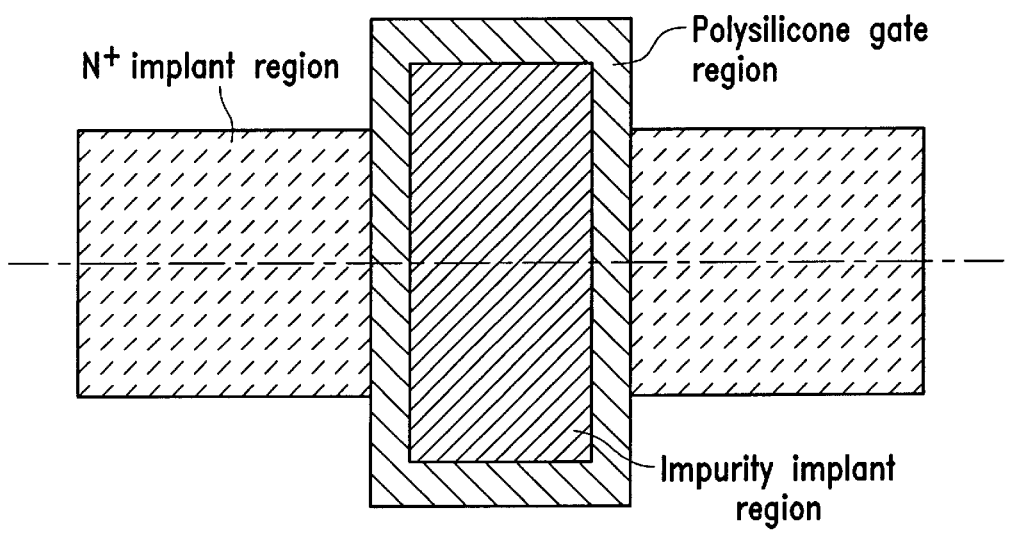
FIG. 14 is a partial plan view of the mode registers 1411 to 141n.

FIG. 13 is a partial cross-sectional view showing the mode registers 1411 to 141n. FIG. 14 is a partial plan view of the mode registers 1411 to 141n.

Figure 15:
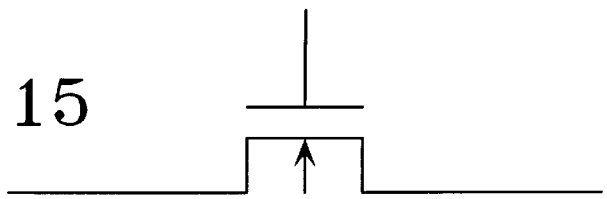
FIG. 15 shows an equivalent circuit diagram of a portion of mode registers 1411 to 141n of FIG. 13.

The portion of the mode registers 1411 to 141n depicted in FIG. 13 includes a P substrate, an N+ implant region, a polysilicon gate region, an $SiO_2$ region, an NSG region, and a BPSG region. A resist patten is formed on the BPSG except above the region into which an impurity is implanted. FIG. 15 shows an equivalent circuit diagram of a portion of the mode registers 1411 to 141n of FIG. 13 (FIG. 15 illustrates the mode registers 1411 to 141n as being conductive). In the illustrated example, the source-drain path will conduct without impurity ions being implanted. When impurity ions are implanted, the source-drain path will not conduct.

In the synchronous mask ROM according to the present invention, setting of initial values in the mode registers 1411 to 141n is performed concurrently with the writing of data to the memory cells.

In general, the writing of data to a mask ROM is accomplished by implanting, into a channel region of each memory cell transistor, ions of an impurity having the same conductivity type as that of the substrate (or well), i.e., an impurity having a different conductivity type from that of the conductivity type of the channel region of the memory cell. For example, in the case of cells composed essentially of NOR-type N channel MOSFETs, the memory cells are turned ON or OFF depending on the presence or absence of implantation of ions of boron (B), which is a P-type impurity.

Figure 16:
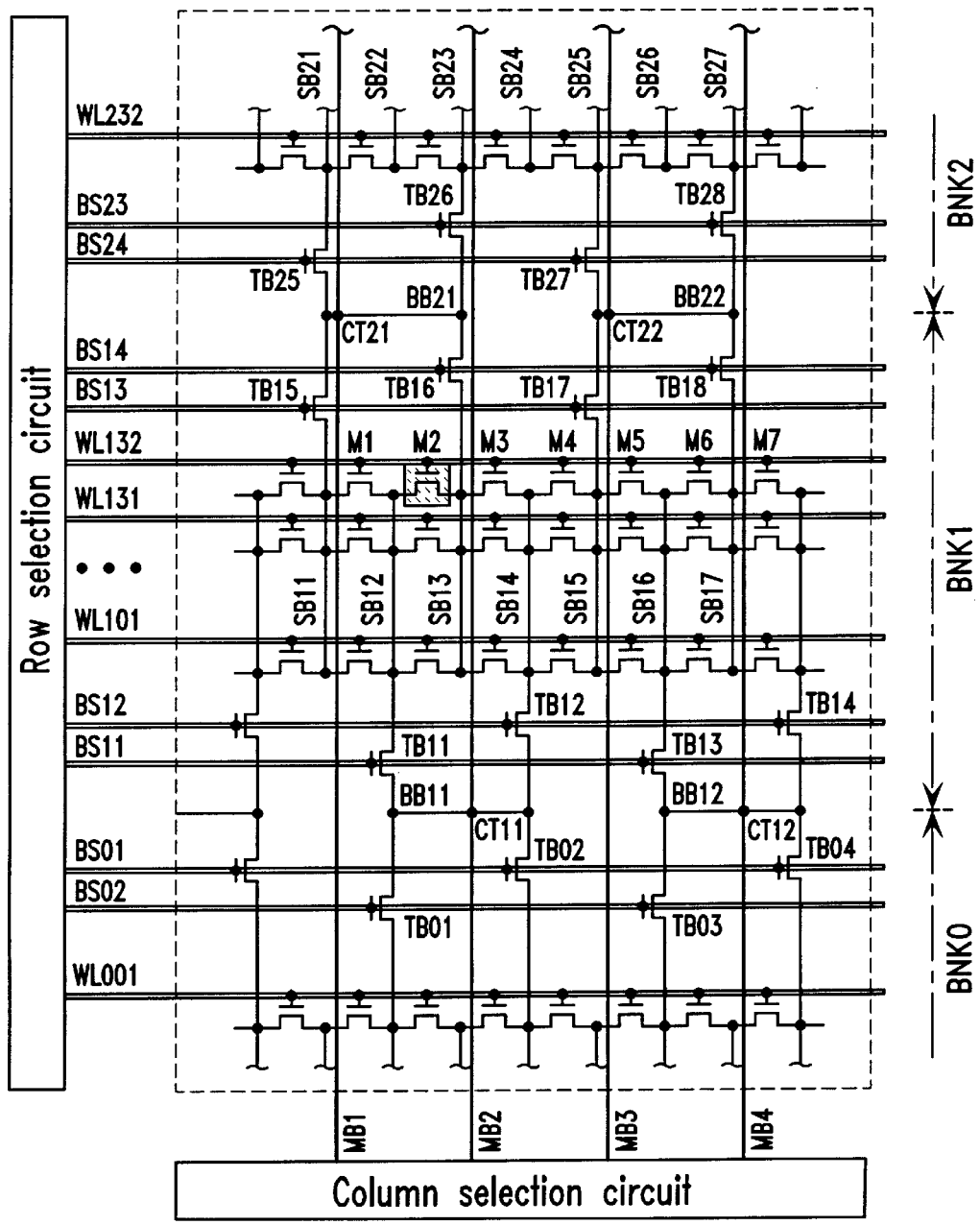
FIG. 16 shows an exemplary circuit of a mask ROM according to the present invention.
Figure 17:
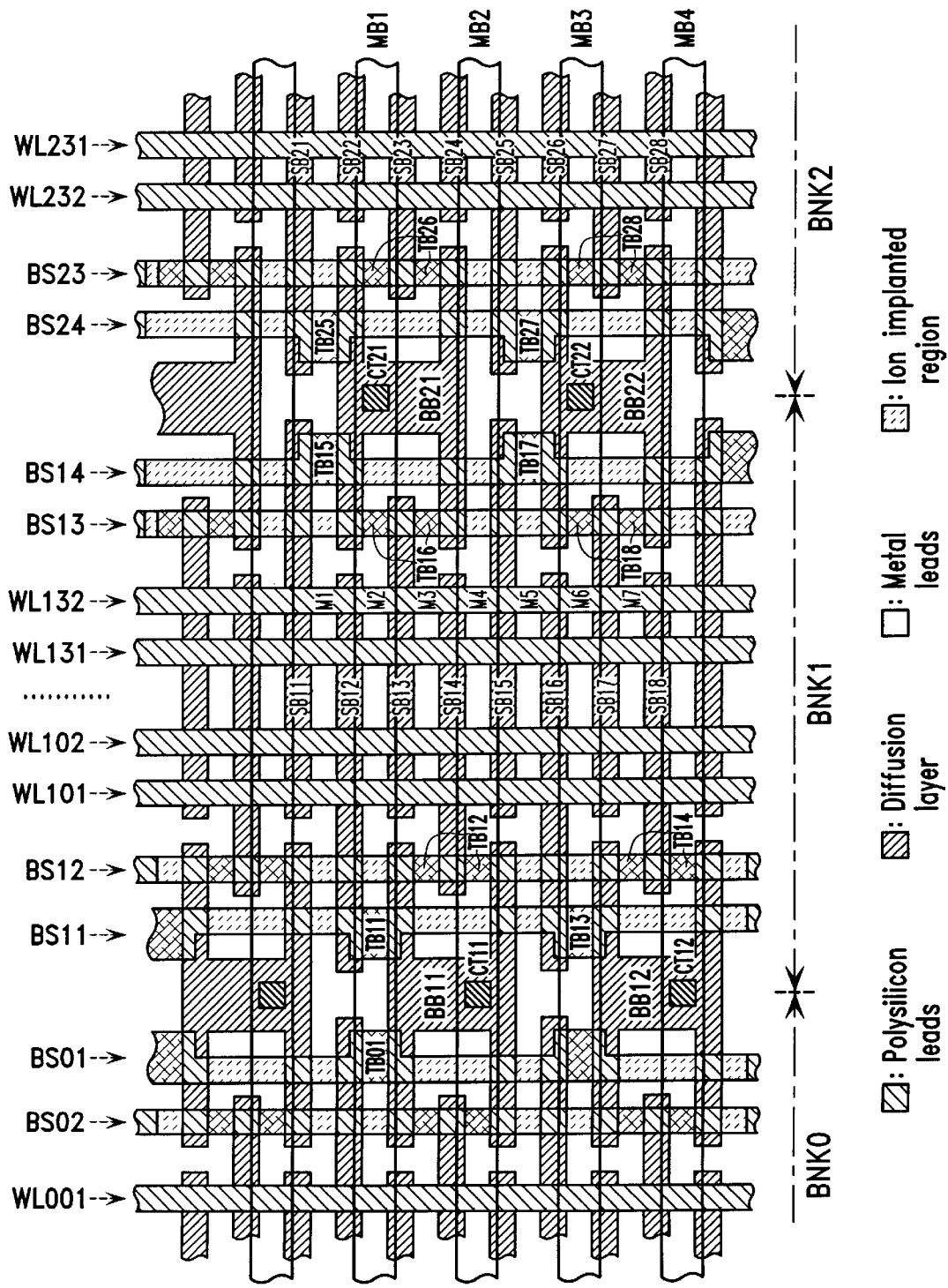
FIG. 17 shows regions into which impurity ions are to be implanted in the mask ROM shown in FIG. 16.
Figure 18:
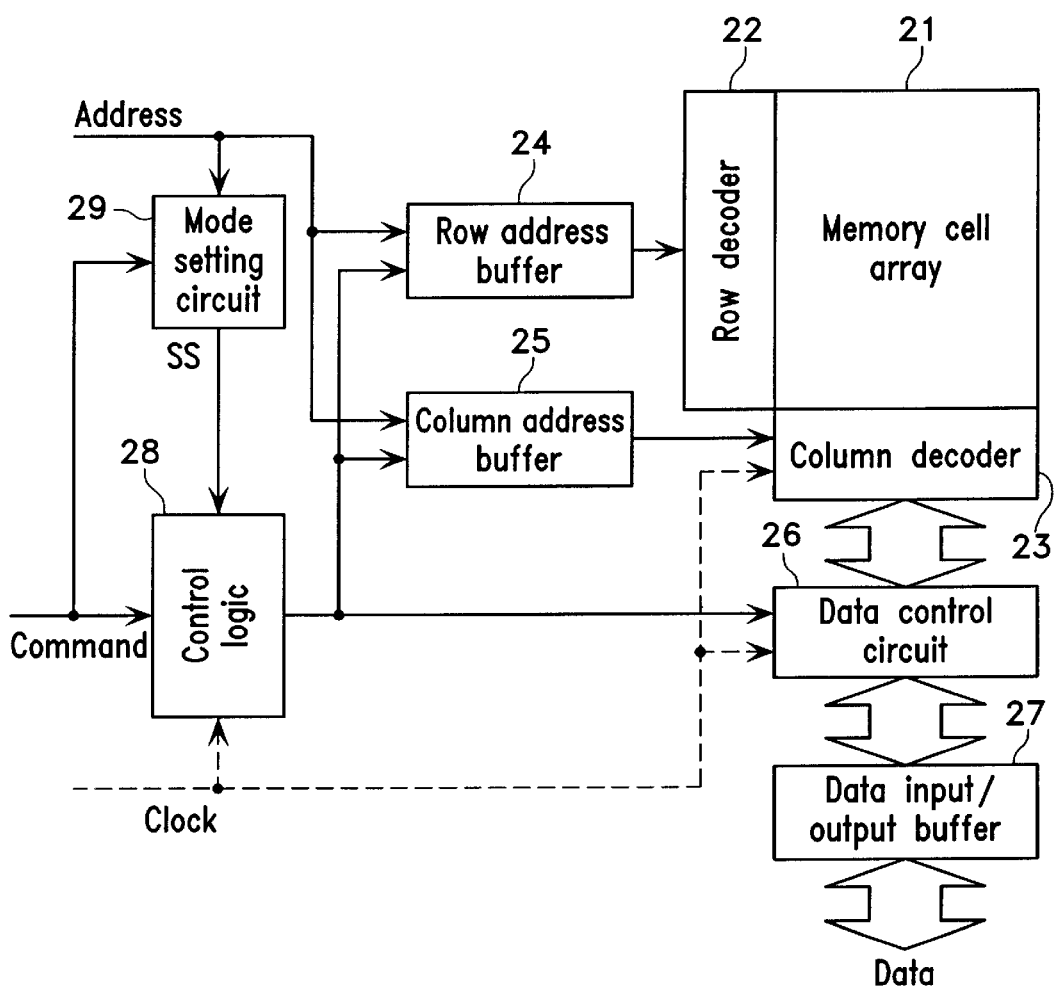
FIG. 18 is a block diagram schematically illustrating the structure of a synchronous DRAM.
Figure 19:
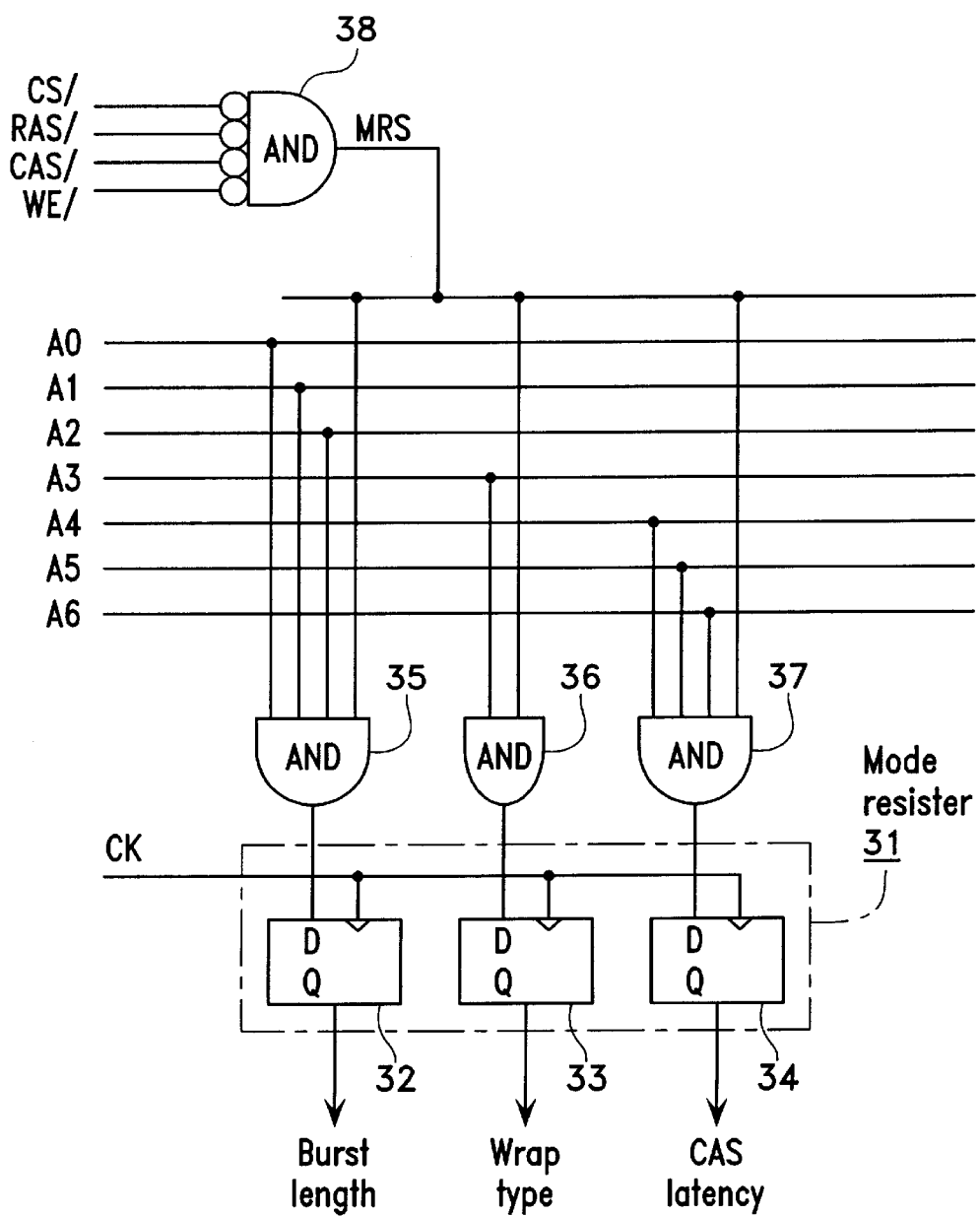
FIG. 19 is a simplified diagram showing the structure of a mode register setting circuit 29.

FIG. 16 shows an exemplary circuit of a mask ROM according to the present example. FIG. 17 shows regions into which impurity ions are to be implanted in the mask ROM shown in FIG. 16. Although not shown in FIG. 17, the substrate surface is covered with a mask (of a resist pattern or the like) except in regions where the impurity ions are to be implanted.

The mode registers according to the present embodiment have the same structure as that shown in FIG. 4 or 5 (or alternatively the structure as that shown in FIG. 3) except for the switch arrangement.

Specifically, in the above-described embodiment, the switches, which are composed of the same type of MOSFETs as those constituting the memory cells of the mask ROM, are selectively set in either an ON or OFF state in accordance with an initial value of each parameter of a given operation mode. That is, when data is written to the memory-cell MOSFETS, impurity ions are simultaneously (i.e., by using the same mask) implanted in the channel regions of the transistors constituting the switching elements in a selective manner. As a result, the switching elements are set to be either ON or OFF as desired.

Data is written to a mask ROM during its manufacturing process in accordance with each specification desired by each user. Since the mode of use of the mask ROM (e.g., operation frequency and the like) is usually known at the time of data writing, it is possible to set a latency value which is optimum in view of design factors such as the power potential.

Moreover, a mask ROM is by nature a read only memory and usually does not accept writing thereto; therefore, realizing a system that performs mode setting to a mask ROM via an initialization routine would complicate the circuitry. In contrast, the structure according to the present invention avoids performing a mode setting via an initialization routine, thereby simplifying the system and memory configuration.

The structures of the mode register selection circuit 142 and the selector 143 according to the above embodiment are the same as those in the previously described embodiments of the invention.

In accordance with the clock-synchronized memory of the present invention, a plurality of mode registers are provided in which predetermined operation mode parameters, e.g., latency, are previously set. It becomes possible to set the optimum latency, etc., in view of a given power potential, by selecting one of the mode registers in accordance with the power potential.

Furthermore, it is unnecessary to produce multiple types of devices with different operation modes which are in accordance with respectively different device specifications. Rather, by only producing one type of device that accommodates the respectively different device specifications, the process and management of manufacture can be prevented from becoming complicated.

In accordance with the clock-synchronized ROM of the present invention, a plurality of mode registers are provided in which predetermined operation mode parameters, e.g., latency, are previously set. It becomes possible to set the optimum latency, etc., in view of a given power potential, by selecting one of the mode registers in accordance with the power potential.

Furthermore, it is unnecessary to produce multiple types of devices with different operation modes which are in accordance with respectively different device specifications. Rather, by only producing one type of device that accommodates the respectively different device specifications, the process and management of manufacture can be prevented from becoming complicated. Furthermore, the present invention makes possible the advantage of performing a mode register setting without the need to employ an additional manufacturing step, thereby preventing increase in chip cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A clock-synchronized memory comprising a plurality of memory cells, and a plurality of mode registers in which variations of particular operation modes are set, the clock-synchronized memory outputting data stored in the plurality of memory cells in one of the variations of the particular operation modes and in synchronization with a clock signal;

wherein the clock-synchronized memory further comprises:

a detection circuit for detecting particular power potentials applied to the clock-synchronized memory; a mode register selection signal output circuit for outputting a selection signal for changing over a plurality of mode registers in accordance to the level of the detected power potentials for selecting an optimum one of the variations of the particular operation modes; and a selection circuit for selecting a given mode register within the plurality of mode registers on the basis of the selected signal.

2. A clock-synchronized memory according to claim 1, wherein the clock-synchronized memory is a clock-synchronized read only memory; and contents of each of the plurality of mode registers are set when the data is written to the memory cell, the contents defining the variation of the particular operation mode.

3. A clock-synchronized memory according to claim 2, wherein each of the plurality of mode registers includes a MOS transistor having a channel region;

the contents which are set in the mode register are written by selectively implanting ions of an impurity into the channel region of the MOS transistor, the impurity having a different conductivity type from a conductivity type of the channel region of the MOS transistor; and the implantation of the ions of the impurity is performed by using a mask which is used when writing the data to the memory cell.

4. A clock-synchronized memory according to claim 1, wherein said variations of said particular operation modes substantially consisting of variations of a burst length referring to number of data units which can be consecutively input or output, a wrap type referring to a sequential method or interleave method for variation of column addresses, and a CAS latency referring to a number of clock pulses that elapse before a first data is read after input of a read command.

* * * * *

UNITED STATES PATENT AND TRADEMARK OFFICE
CERTIFICATE OF CORRECTION

PATENT NO.    : 6,215,725 B1
DATED         : April 10, 2001
INVENTOR(S)   : Koji Komatsu It is certified that error appears in the above-identified patent and that said Letters Patent is hereby corrected as shown below:

<u>Title page,</u>
Item [63], Related U.S. Application Data, should read:
-- Continuation of application No 09/119,807, filed on Jul. 20, 1998, now Pat. No. 6,047,726. --

Signed and Sealed this

Twenty-fourth Day of June, 2003

JAMES E. ROGAN
*Director of the United States Patent and Trademark Office*